(12) United States Patent
Zhang

(10) Patent No.: US 7,190,420 B2
(45) Date of Patent: Mar. 13, 2007

(54) DISPLAY DEVICE

(75) Inventor: Hongyong Zhang, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 09/816,492

(22) Filed: Mar. 23, 2001

(65) Prior Publication Data

US 2001/0035919 A1 Nov. 1, 2001

Related U.S. Application Data

(60) Continuation of application No. 09/062,874, filed on Apr. 20, 1998, now Pat. No. 6,219,118, which is a division of application No. 08/646,512, filed on May 7, 1996, now Pat. No. 5,777,701.

(30) Foreign Application Priority Data

May 8, 1995 (JP) .............................. 7-134810
Feb. 21, 1996 (JP) .............................. 8-58500

(51) Int. Cl.
G02F 1/136 (2006.01)
G02F 1/1343 (2006.01)

(52) U.S. Cl. ......................................... 349/44; 349/139
(58) Field of Classification Search .................. 349/42, 349/43, 44, 110, 139
See application file for complete search history.

(56) References Cited

U.S. PATENT DOCUMENTS 4,759,610 A * 7/1988 Yanagisawa ................. 349/38
4,948,231 A * 8/1990 Aoki et al. .................... 349/44
5,003,356 A * 3/1991 Wakai et al. ................ 257/390
5,051,570 A 9/1991 Tsujikawa et al.

(Continued)

FOREIGN PATENT DOCUMENTS

| JP | 64-042635 | 2/1989 |
| JP | 1-183628 | 7/1989 |
| JP | 02-063020 | 3/1990 |
| JP | 03-196020 | 8/1991 |
| JP | 04-051121 | 2/1992 |
| JP | 04-090513 | 3/1992 |
| JP | 4-194823 | 7/1992 |
| JP | 04-318513 | 11/1992 |
| JP | 04-318523 | 11/1992 |
| JP | 05-127195 | 5/1993 |
| JP | 05-181159 | 7/1993 |
| JP | 05-257164 | 10/1993 |
| JP | 06-011728 | 1/1994 |
| JP | 06-148684 | 5/1994 |
| JP | 07-248507 | 9/1995 |

OTHER PUBLICATIONS

Pending Claims in Application Ser. No. 11/002,659 filed Dec. 3, 2004 (8 pages).

*Primary Examiner*—Toan Ton
(74) *Attorney, Agent, or Firm*—Fish & Richardson P.C.

(57) ABSTRACT

A metal electrode also serving as a black matrix is so formed as to cover the periphery of an ITO pixel electrode. A region where the pixel electrode and the metal electrode coextend also serves as an auxiliary capacitor. Since the auxiliary capacitor can be formed by using a thin insulating film, it can have a large capacitance. By virtue of the structure in which the black matrix also serves as the auxiliary capacitor, it is not necessary to provide an electrode dedicated to the auxiliary capacitor, thereby preventing reduction in aperture ratio. Further, the black matrix can completely shield a source line and a gate line from light.

25 Claims, 3 Drawing Sheets

U.S. PATENT DOCUMENTS

| | | | |
|---|---|---|---|
| 5,162,933 A | 11/1992 | Kakuda et al. | 349/38 |
| 5,182,620 A | 1/1993 | Shimada et al. | |
| 5,185,601 A | 2/1993 | Takeda et al. | 349/39 |
| 5,317,433 A | 5/1994 | Miyawaki et al. | |
| 5,327,001 A * | 7/1994 | Wakai et al. | 349/44 |
| 5,339,181 A | 8/1994 | Kim et al. | |
| 5,459,595 A | 10/1995 | Ishiguro et al. | 349/44 |
| 5,459,596 A | 10/1995 | Ueda et al. | 349/39 |
| 5,499,123 A * | 3/1996 | Mikoshiba | 349/110 |
| 5,500,538 A | 3/1996 | Yamazaki et al. | |
| 5,517,341 A | 5/1996 | Kim et al. | 349/42 |
| 5,585,951 A | 12/1996 | Noda et al. | |
| 5,641,974 A | 6/1997 | Den Boer et al. | |
| 5,694,185 A | 12/1997 | Oh | |
| 5,708,485 A * | 1/1998 | Sato et al. | 349/42 |
| 5,717,224 A * | 2/1998 | Zhang | 349/44 |
| 5,744,821 A * | 4/1998 | Song | 349/110 |
| 5,784,132 A * | 7/1998 | Hashimoto | 349/44 |
| 5,805,247 A * | 9/1998 | Oh-e et al. | 349/110 |
| 5,870,158 A * | 2/1999 | Abe et al. | 349/111 |
| 5,956,103 A * | 9/1999 | Ishiguro | 349/111 |
| 2005/0099557 A1 | 5/2005 | Zhang | |

* cited by examiner

DISPLAY DEVICE

This is a continuation of U.S. application Ser. No. 09/062,874, filed Apr. 20, 1998 now U.S. Pat. No. 6,219,118, a divisional of U.S. application Ser. No. 08/646,512, filed May 7, 1996 now U.S. Pat. No. 5,777,701.

BACKGROUND OF THE INVENTION

1. Field of the Invention

The present invention relates to the structure of a pixel region of an active matrix display device and, more specifically, to the structure of a black matrix (BM) and auxiliary capacitors that are connected in parallel to respective pixel electrodes.

Further, the invention generally relates to the structure of a pixel region of flat panel displays that require a black matrix.

2. Description of the Related Art

Active matrix liquid crystal display devices are known, in which at least one thin-film transistor is connected to each of a number of pixel electrodes which are arranged in a matrix form, and charging and discharging of each pixel electrode is controlled by the associated thin-film transistor.

Each pixel electrode constitutes a capacitor together with a counter electrode that is opposed to the pixel electrode with a liquid crystal therebetween.

In actual operation, however, since the capacitance of the capacitor constituted by each pixel electrode portion is not sufficiently large, an auxiliary capacitor is desired. However, when an electrode of the auxiliary capacitor is made of a conductive material such as a metal, it acts as a light-shielding portion in each pixel, resulting in a decrease of the aperture ratio.

On the other hand, a light-shielding member called "black matrix" is needed around each pixel electrode.

In general, regions where source lines (wiring lines for supplying currents to the respective source regions of the thin-film transistors) and gate lines (wiring lines for applying signal voltages to the respective gate electrodes of the thin-film transistors) are arranged in a matrix form have an uneven surface. As a result, a rubbing operation on an orientation film can not be performed properly in those regions, so that the orientation of liquid crystal molecules may be disordered there. This may cause a phenomenon that light leaks undesirable or, conversely, a desired quantity of light is not transmitted around the pixels. Further, the liquid crystal may be disabled from performing a desired electro-optical operation in the above regions.

If the above phenomenon occurs, a displayed image is blurred around the pixels, to thereby impair clearness of the image as a whole.

There is known a structure for solving the above problems in which structure a light-shielding film is so formed as to cover the edges of the pixel electrodes. The light-shielding film is called "black matrix" (BM).

U.S. Pat. No. 5,339,181 discloses a structure including a black matrix. In this technique, as shown in FIG. 2C of this patent, a black matrix extending from gate lines is so formed as to overlap with the edges of pixel electrodes. This structure is adapted to form auxiliary capacitors in overlapping portions of the black matrix and the pixel electrodes.

However, the technique of this patent has the following two problems. First, since the black matrix extends from the gate lines. First shielding is not complete. This is because source lines cannot be overlapped with the black matrix to avoid crosstalk. Light leakage should be tolerated in those portions.

Second, since the black matrix occupies the same plane as the gate lines, naturally it cannot perform light shielding for the gate lines themselves. Further, the black matrix cannot perform light shielding for the source lines to avoid crosstalk as described above.

With the recent development of digital equipments, influences of electromagnetic waves from low-frequency waves to microwaves have come to cause problems. In an environment where a liquid crystal electro-optical device is used, there is concern about the influences of electromagnetic waves.

Therefore, liquid crystal display devices need to be so constructed as to be insensitive to external electromagnetic waves.

In view of the above, the above structure as described in U.S. Pat. No. 5,339,181 in which the source lines and gate lines which transmit image signals are exposed to external electromagnetic waves is not preferable, because the source lines and gate lines may serve as an antenna.

SUMMARY OF THE INVENTION

An object of the present invention is to provide a pixel structure of an active matrix liquid crystal display device which structure enables effective light shielding by means of a black matrix.

Another object of the invention is to provide a structure capable of protecting the entire device from being influenced by external electromagnetic waves.

A further object of the invention is to form auxiliary capacitors having a necessary capacitance without reducing the aperture ratio.

According to a first aspect of the invention, there is provided a display device (as shown in FIGS. 1 and 2) comprising:

source lines 113 and gate lines 110 arranged in a matrix form;

at least one pixel electrode 118 disposed in each region that is enclosed by the source lines 113 and the gate lines 110; and a light shielding electrode 116 so disposed as to cover the source lines 113 and the gate lines 110, wherein a periphery of the pixel electrode 118 overlaps with the light shielding electrode 116, and a coextending region 119 or 120 thereof serves as an auxiliary capacitor.

With this configuration, all the components other than the pixel electrode 118 and a drain electrode 106 of a thin-film transistor 103 can be shielded from incident light. In particular, the source lines 113 and the gate lines 110 can completely be shielded from the exterior. This prevents an event that external electromagnetic waves are received by the source lines 113 and the gate lines 110 to cause an erroneous or faulty operation of the device.

Auxiliary capacitors can be formed without reducing the aperture ratio.

In the above configuration, the pixel electrode 118 is a transparent conductive film made of ITO, for instance. While one pixel electrode is provided in each pixel in the basic configuration, the pixel electrode of each pixel may be divided into a plurality of parts.

The black matrix 116, which is so disposed as to overlap with the periphery of the pixel electrode 118, is made of titanium or chromium. The black matrix 116 serves as not only the light-shielding film but also one of the electrodes constituting an auxiliary capacitor.

It is preferable that the metal electrode 116 be so formed as to overlap with the periphery of the pixel electrode 118 over its entire circumference. FIGS 3A–3E are plan views for explaining the locational relationship of each element of FIG. 2.

According to another aspect of the invention, there is provided, as exemplified in FIGS. 1 and 2, a display device comprising:

source lines 113 and gate lines 110 arranged in a matrix form; at least one pixel electrode 118 disposed in each region that is enclosed by the source lines 113 and the gate lines 110; and a light-shielding electrode 116 so disposed as to overlap with a periphery of the pixel electrode 118, wherein the pixel electrode 118 and the light-shielding electrode 116 constitute a capacitor through an insulating film 117, and wherein the light-shielding electrode 116 exists in a different layer than the source lines 113 and the gate lines 110.

According to a further aspect of the invention, there is provided, as exemplified in FIGS. 1 and 2, a display device comprising in an order as written from the side of incident light (i.e., from the top of FIG. 1):

a pixel electrode 118;

a light-shielding electrode 116;

a source line 113; and a gate line 110, wherein the pixel electrode 118 and the light-shielding electrode 116 constitute a capacitor 119 or 120 in between.

In this configuration, by disposing the pixel electrode 118 closest to the incident light side and disposing the light-shielding electrode (black matrix) 116 next to the pixel electrode 118, the underlaid source line 113, gate line 110, and thin-film transistor (except for a drain region 106) can completely be shielded from incident light.

This configuration is very useful for not only light shielding but also elimination of influences of external electromagnetic waves.

Further, the capacitors 119 and 120 can be formed without reducing the aperture ratio.

DETAILED DESCRIPTION OF THE PREFERRED EMBODIMENTS

Figure 1:
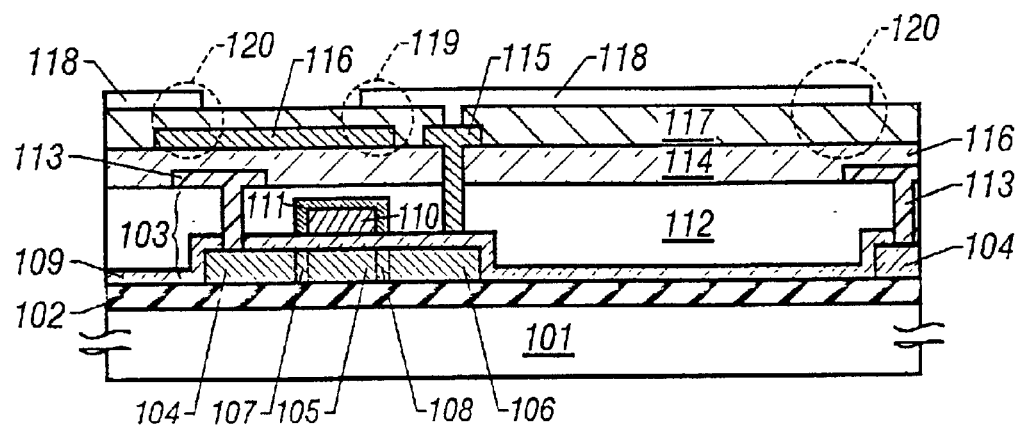
FIG. 1 is a sectional view showing the structure of a pixel region of an active matrix liquid crystal display device.
Figure 2:
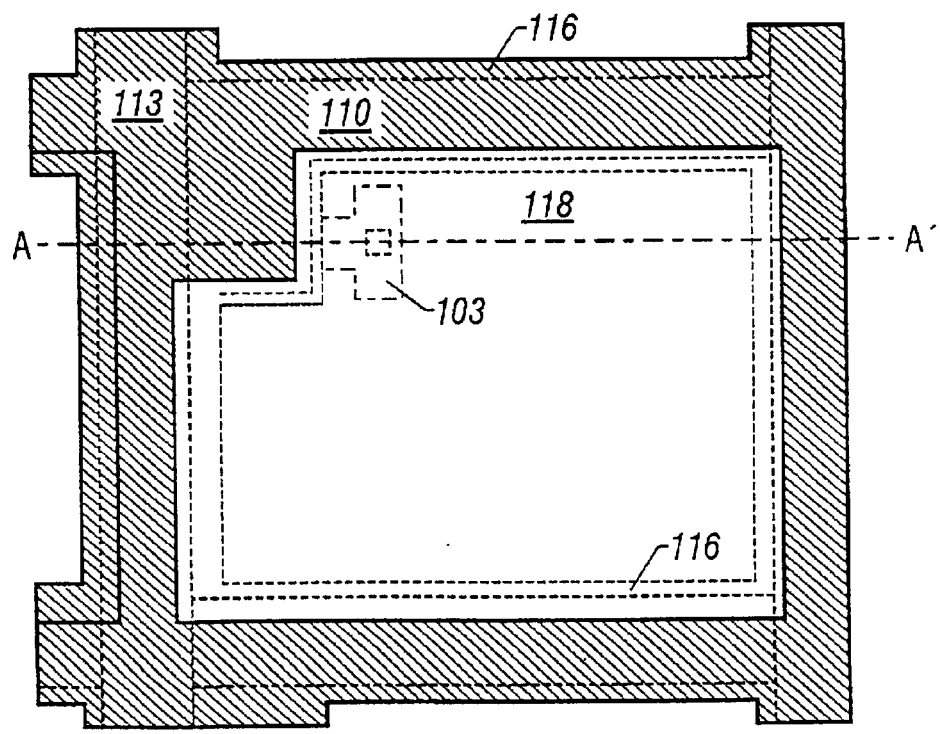
FIG. 2 is a top view of the pixel region of FIG. 1.
Figure 3A:
FIGS. 3A–3E are plane views for showing the locational relationship of each element of FIG. 2.
Figure 3B:
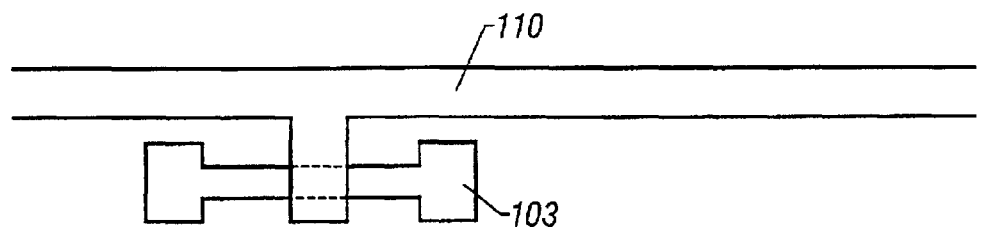
Figure 3C:
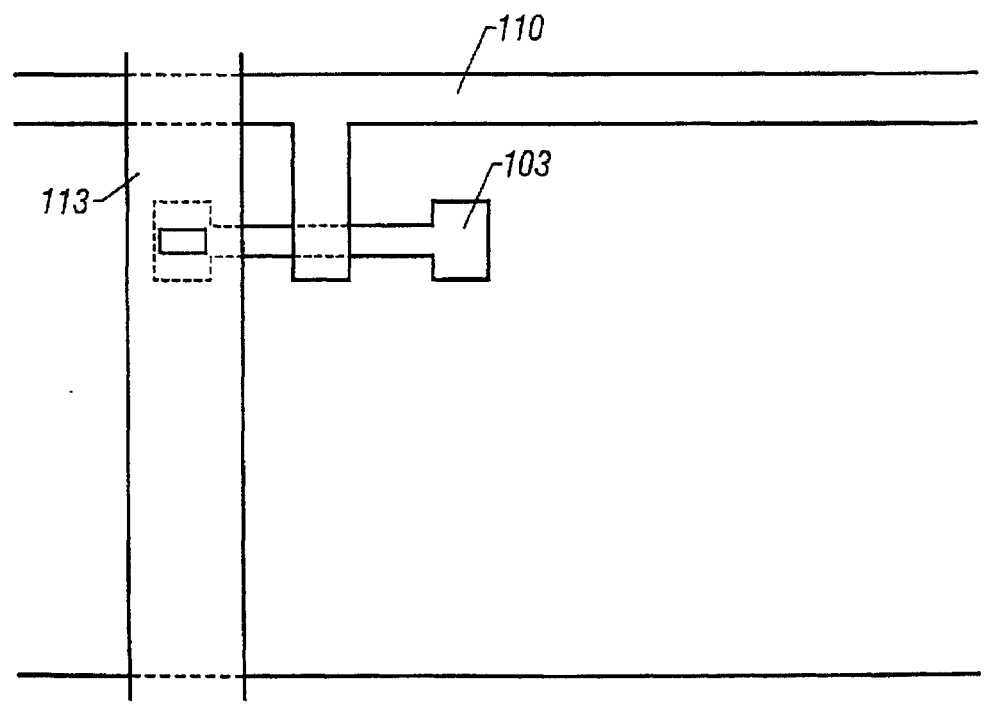
Figure 3D:
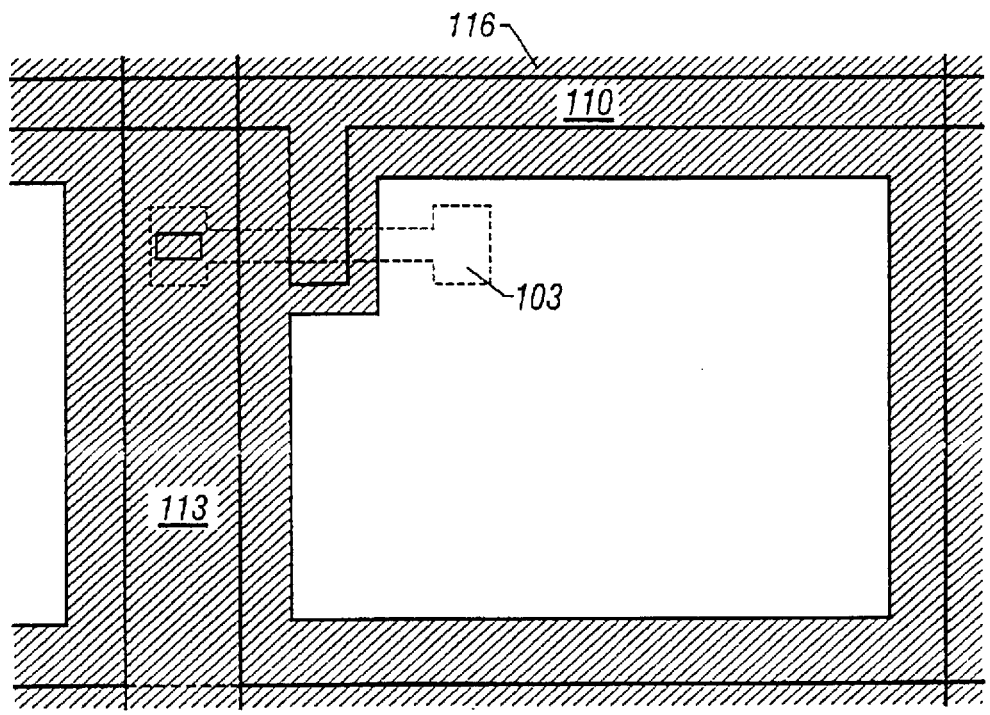
Figure 3E:
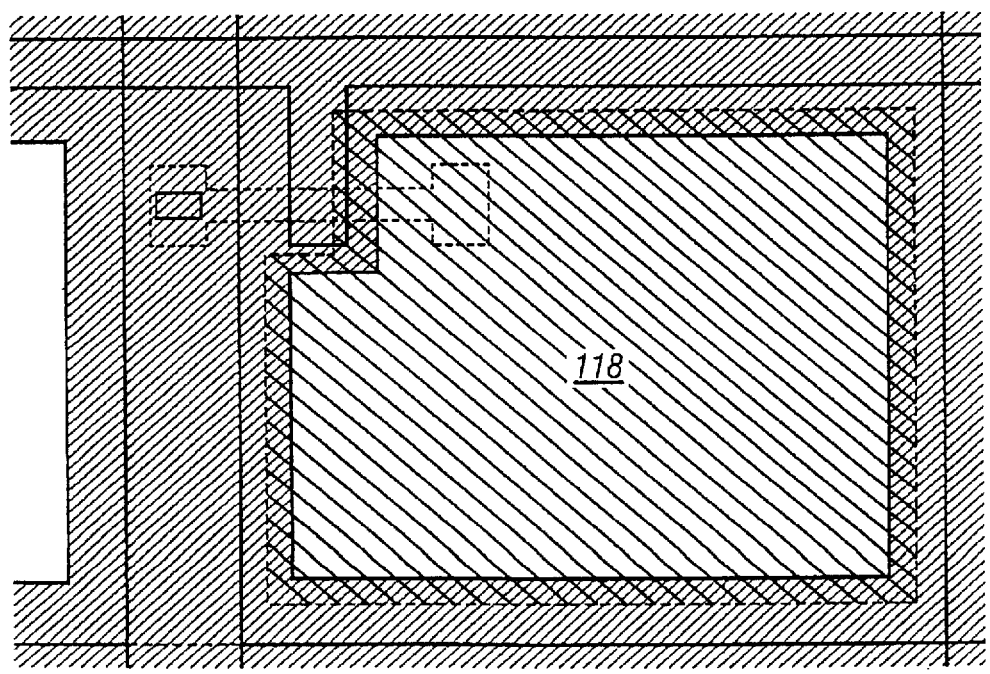

FIGS. 1 and 2 show the structure of an active matrix liquid crystal display device that utilizes the present invention.

FIG. 1 is a sectional view taken along line A–A' in FIG. 2. FIGS. 1 and 2 show the structure of a single pixel that constitutes a pixel area (the pixel area consists of many pixels) of an active matrix liquid crystal display device.

FIGS. 1 and 2 show only the structure on the side of a substrate on which thin-film transistors are arranged. Actually, there exists another substrate opposed to it. A liquid crystal is interposed between the two substrates through a gap of about several micrometers.

In FIGS. 1 and 2, reference numeral 103 denotes a thin-film transistor, and 101 denotes a glass substrate. Alternatively, a quartz substrate may be used. Reference numeral 102 denotes a silicon oxide film as an undercoat film. An active layer of the thin-film transistor 103 consists of a source region 104, offset gate regions 107 and 108, a channel forming region 105, and a drain region 106. The active layer is made of a crystalline silicon film that has been crystallized by heating an amorphous silicon film or illuminating it with laser light.

Reference numeral 109 denotes a silicon oxide film including a gate insulating film, and 110 denotes a gate electrode mainly made of aluminum and extending from a gate line. In FIG. 1, numeral 110 denotes both of the gate electrode and the gate line.

Reference numeral 111 denotes an anodic oxide film that has been formed by anodization using the aluminum gate electrode 110 as the anode.

Reference numeral 112 denotes a first interlayer insulating film that is a silicon oxide film. Numeral 113 denotes a lead-out electrode connected to the source region 104 and extending from a source line. In FIG. 1, numeral 113 denotes both of the source electrode and the source line.

Reference numeral 115 denotes a lead-out line connected to the drain region 106 as well as to an IT0 electrode 118 serving as a pixel electrode. Reference numerals 114 and 117 denote second and third interlayer insulating films, respectively.

Reference numeral 116 denotes a titanium electrode also serving as a black matrix. Alternatively, a chromium film or the like may be used. To allow the titanium film 116 to serve as the black matrix, it is so formed as to overlap with the periphery of the pixel electrode 118.

Auxiliary capacitors are formed in regions 119 and 120 where the titanium electrode 116 and the pixel electrode 118 coextend with a portion of the third interlayer insulating film 117 interposed in between. These capacitors can have a large capacitance because the insulating film 117 can be made thin.

Since the titanium electrode 116 shields also the gate line 110 and the source line 113 from light, it can prevent charge generation and accumulation there due to illumination with strong light. The titanium electrode 116 also serves as a shield against external electromagnetic waves: it has a function of preventing the gate line 110 and the source line 113 from acting as an antenna, to thereby prevent the device from receiving undesired signals.

The titanium electrode 116 is so formed as to also cover the thin-film transistor 103. This is to prevent an event that light irradiating the thin-film transistor 103 affects its operation. Further, although not shown in the drawings, the electrode 116 is set to an electrically same potential as a counter electrode.

Although the insulating film 117 is a single layer in the above embodiment, it may have a multi-layer structure.

As described above, by overlapping the black matrix and the periphery of the pixel electrode through the insulating film, the coextending portion serves as the auxiliary capacitor. This structure prevents reduction in pixel aperture ratio. Further, since the insulating film can be made thin, the auxiliary capacitor can have a large capacitance.

The black matrix can provide effective light shielding as well as protect the entire device from external electromagnetic waves.

The present invention can be applied to not only active matrix liquid crystal electro-optical devices but also flat panel displays that require a pixel electrode, a black matrix covering its periphery, and an auxiliary capacitor connected to a thin-film transistor.

What is claimed is:

1. A display device comprising:
   a substrate;
   a plurality of parallel source lines and a plurality of parallel gate lines formed over said substrate, said source line and gate lines being arranged relative to one another to form a matrix of pixel regions over said substrate with each of said pixel regions bounded by two adjacent source lines and two adjacent gate lines;
   a plurality of thin film transistors formed over said substrate, with at least one thin film transistor disposed at each intersection of said source lines and gate lines such that at least one thin film transistor is located in each of said pixel regions;
   a first interlayer insulating film formed over said thin film transistors;
   a black matrix comprising a light shielding layer formed over said first interlayer insulating film, said light shielding layer being disposed to cover at least said gate lines;
   a conductive layer formed on a same layer as said black matrix;
   a second interlayer insulating film formed over said light shielding layer and said conductive layer; and
   a pixel electrode disposed in each of said pixel regions over said second interlayer insulating film and electrically connected to one of said thin film transistors through at least said conductive layer, wherein a periphery of said pixel electrode overlaps with said light shielding layer and at least one of said source lines.

2. A display device according to claim 1 further comprising a counter electrode in electrical communication with said light shielding layer, wherein said light shielding layer is electrically connected to a same potential as said counter electrode.

3. A display device according to claim 1 wherein said second interlayer insulating film is interposed between said pixel electrode and said first interlayer insulating film and prevents any direct electrical contact therebetween.

4. A display device according to claim 1 wherein said second interlayer insulating film as a flat upper surface over said light shielding layer.

5. A display device according to claim 1 further comprising an insulating film comprising silicon oxide formed over said substrate.

6. A display device according to claim 1 wherein said pixel electrode is transparent.

7. A display device according to claim 1 wherein said light shielding layer comprises chromium.

8. A display device according to claim 1 wherein said light shielding layer comprises titanium.

9. A display device comprising:
   a substrate;
   a plurality of parallel source lines and a plurality of parallel gate lines formed over said substrate, said source lines and gate lines being arranged relative to one another to form a matrix of pixel regions over said substrate;
   a plurality of thin film transistors formed over said substrate, with at least one thin film transistor disposed at each intersection of said source lines and gate lines such that at least one thin film transistor is located in each of said pixel regions;
   a first interlayer insulating film formed over said thin film transistors;
   a light shielding conductive layer formed over said first interlayer insulating film, said light shielding conductive layer being disposed to cover said gate lines;
   a second conductive layer formed on a same layer as said light shielding conductive layer;
   a second insulating film formed over said light shielding conductive layer; and
   a pixel electrode disposed in each of said pixel regions over said second insulating film and electrically connected to one of said thin film trasistors through at least said second conductive layer, wherein a periphery of said pixel electrode overlaps with said light shielding conductive layer,
   wherein a periphery of said pixel electrode is overlapped with a corresponding one of said source lines.

10. A display device according to claim 9 wherein said thin film transistors have a top-gate structure.

11. A display device according to claim 9 wherein said pixel electrode is transparent.

12. A display device according to claim 9 wherein said light shielding conductive layer constitutes a black matrix.

13. A display device comprising:
    a substrate;
    a plurality of gate lines and a plurality of source lines formed over said substrate;
    a plurality of pixel regions defined by said gate lines and said source lines;
    a plurality of thin film transistors formed over said substrate, with at least one thin film transistor being disposed in each of said pixel regions;
    a first insulating layer formed over said thin film transistors;
    a light shielding conductive layer formed over said first insulating layer, said light shielding conductive layer being disposed to cover at least said gate lines;
    a second conductive layer formed on a same layer as said light shielding conductive layer;
    a second insulating layer formed over said light shielding conductive layer and said second conductive layer;
    a pixel electrode formed over the second insulating layer in each of said pixel regions and electrically connected to one of said thin film transistors through at least said second conductive layer,
    wherein said pixel electrode is overlapped with said light shielding conductive layer with said second insulating layer interposed therebetween, and a periphery of said pixel electrode is overlapped with the source lines and the gate lines which define the corresponding pixel region.

14. A display device according to claim 13 wherein said thin film transistors have a top-gate structure.

15. A display device according to claim 13 wherein said pixel electrode is transparent.

16. A display device according to claim 13 wherein said light shielding conductive layer constitutes a black matrix.

17. A display device comprising:
    a substrate;
    a plurality of parallel source lines and a plurality of parallel gate lines formed over said substrate, said source lines and gate lines being arranged relative to one another to form a matrix of pixel regions over said substrate;

a plurality of thin film transistors formed over said substrate, with at least one thin film transistor disposed at each intersection of said source lines and gate lines such that at least one thin film transistor is located in each of said pixel regions;

a first interlayer insulating film formed over said thin film transistors;

a light shielding conductive layer formed over said first interlayer insulating film, said light shielding conductive layer being disposed to cover said gate lines;

a second conductive layer formed on a same layer as said light shielding conductive layer;

a second insulating film formed on said light shielding conductive layer and said second conductive layer;

a pixel electrode disposed in each of said pixel regions on said second insulating film and electrically connected to one of said thin film transistors through at least said second conductive layer, wherein a periphery of said pixel electrode overlaps with said light shielding conductive layer and at least one of said source lines, wherein a periphery of said pixel electrode is overlapped with corresponding ones of gate lines and said light shielding conductive layer extends in an overlapped portion between the pixel electrode and said one of the gate lines.

18. A display device according to claim 17 wherein said thin film transistors have top-grade structure.

19. A display device according to claim 17 wherein said pixel electrode is transparent.

20. A display device according to claim 17 wherein said light shielding conductive layer constitutes a black matrix.

21. A display device comprising:

a substrate;

a plurality of gate lines and a plurality of source lines formed over said substrate;

a plurality a pixel regions defined by said gate lines and said source lines;

a plurality of thin film transistors formed over said substrate, with at least one thin film transistor being disposed in each of said pixel regions;

a first interlayer insulating film formed over said thin film transistors;

a light shielding conductive layer formed over said first insulating layer, said light shielding conductive layer being disposed to cover said gate lines;

a second conductive layer formed on a same layer as said light shielding conductive layer;

a second interlayer insulating film formed over said light shielding conductive layer and said second conductive layer; and a pixel electrode formed over the second insulating layer in each of said pixel regions and electrically connected with said second conductive layer;

wherein said pixel electrode is overlapped with said light shielding conductive layer with said second insulating layer interposed therebetween, and a periphery of said pixel electrode is overlapped with the source lines and the gate lines which define the corresponding pixel region.

22. A display device according to claim 21 where said thin film transistors have a top-gate structure.

23. A display device according to claim 21 wherein said pixel electrode is transparent.

24. A display device according to claim 21 wherein said light shielding conductive layer constitutes a black matrix.

25. A display device according to claim 21 further comprising a counter electrode in electrical communication with said light shielding layer, wherein said light shielding layer is electrically connected to same potential as said counter electrode.

* * * * *